(12) United States Patent
Dunn et al.

(10) Patent No.: US 10,080,316 B2
(45) Date of Patent: *Sep. 18, 2018

(54) ELECTRONIC DISPLAY ASSEMBLY HAVING THERMAL COOLING PLATE AND OPTIONAL CONVECTIVE AIR COOLING LOOP

(71) Applicant: Manufacturing Resources International, Inc., Alpharetta, GA (US)

(72) Inventors: William Dunn, Alpharetta, GA (US); Don Le, Alpharetta, GA (US); Ware Bedell, Cummings, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 137 days.

This patent is subject to a terminal disclaimer.

(21) Appl. No.: 15/095,880

(22) Filed: Apr. 11, 2016

(65) Prior Publication Data

US 2016/0249493 A1    Aug. 25, 2016

Related U.S. Application Data

(63) Continuation of application No. 13/954,469, filed on Jul. 30, 2013, now Pat. No. 9,313,917, which is a
(Continued)

(51) Int. Cl.
*H05K 7/20* (2006.01)
*G02F 1/1333* (2006.01)
(Continued)

(52) U.S. Cl.
CPC ........... *H05K 7/20972* (2013.01); *F28F 3/00* (2013.01); *G02F 1/133382* (2013.01);
(Continued)

(58) Field of Classification Search
CPC .................. F28F 3/00; G02F 1/133382; G02F 1/133385; G02F 1/133615;
(Continued)

(56) References Cited

U.S. PATENT DOCUMENTS 4,093,355 A    6/1978  Kaplit et al.
4,593,978 A    6/1986  Mourey et al.
(Continued)

FOREIGN PATENT DOCUMENTS

CN    2702363 Y    5/2005
EP    1408476 A1   4/2004
(Continued)

OTHER PUBLICATIONS

Itsenclosures, Product Catalog, 2009, 48 pages.
(Continued)

*Primary Examiner* — Huyen Ngo
(74) *Attorney, Agent, or Firm* — Standley Law Group LLP

(57) ABSTRACT

Disclosed herein is an electronic display assembly including a backlight that is positioned to illuminate a liquid crystal display, and a novel cooling mechanism in the form of a thermal plate that is located and configured to transfer heat from the backlight to a thermally conductive housing of the electronic display assembly. The thermal plate is preferably placed in conductive thermal communication with the backlight and with the thermally conductive housing for this purpose. One or more air flow apertures may pass through the thermal plate. A convective cooling loop may also be provided, which cooling loop may include a fan that is located to move cooling air over the thermal plate and/or though one or more apertures in the thermal plate. Both a top and bottom thermal plate may be employed in some exemplary embodiments.

20 Claims, 5 Drawing Sheets

Related U.S. Application Data continuation of application No. 12/630,469, filed on Dec. 3, 2009, now Pat. No. 8,497,972, which is a continuation-in-part of application No. 12/618,104, filed on Nov. 13, 2009, now Pat. No. 8,310,824.

(51) Int. Cl.
*F28F 3/00* (2006.01)
*G02F 1/1335* (2006.01)

(52) U.S. Cl.
CPC .. *G02F 1/133385* (2013.01); *G02F 1/133615* (2013.01); *H05K 7/20154* (2013.01); *H05K 7/20963* (2013.01); *G02F 2001/133342* (2013.01); *G02F 2201/36* (2013.01)

(58) Field of Classification Search
CPC .... G02F 2001/133342; G02F 2201/36; H05K 7/20154; H05K 7/20963; H05K 7/20972
See application file for complete search history.

(56) References Cited

U.S. PATENT DOCUMENTS

| | | |
|---|---|---|
| 4,634,225 A | 1/1987 | Haim et al. |
| 4,748,765 A | 6/1988 | Martin |
| 4,763,993 A | 8/1988 | Vogeley et al. |
| 4,921,041 A | 5/1990 | Akachi |
| 4,952,783 A | 8/1990 | Aufderheide et al. |
| 4,952,925 A | 8/1990 | Haastert |
| 5,029,982 A | 7/1991 | Nash |
| 5,088,806 A | 2/1992 | McCartney et al. |
| 5,132,666 A | 7/1992 | Fahs |
| 5,247,374 A | 9/1993 | Terada |
| 5,282,114 A | 1/1994 | Stone |
| 5,293,930 A | 3/1994 | Pitasi |
| 5,432,526 A | 7/1995 | Hyatt |
| 5,535,816 A | 7/1996 | Ishida |
| 5,559,614 A | 9/1996 | Urbish et al. |
| 5,621,614 A | 4/1997 | O'Neill |
| 5,657,641 A | 8/1997 | Cunningham et al. |
| 5,748,269 A | 5/1998 | Harris et al. |
| 5,765,743 A | 6/1998 | Sakiura et al. |
| 5,767,489 A | 6/1998 | Ferrier |
| 5,808,418 A | 9/1998 | Pitman et al. |
| 5,818,010 A | 10/1998 | McCann |
| 5,818,694 A | 10/1998 | Daikoku et al. |
| 5,835,179 A | 11/1998 | Yamanaka |
| 5,864,465 A | 1/1999 | Liu |
| 5,869,818 A | 2/1999 | Kim |
| 5,869,919 A | 2/1999 | Sato et al. |
| 5,903,433 A | 5/1999 | Gudmundsson |
| 5,991,153 A | 11/1999 | Heady et al. |
| 6,003,015 A | 12/1999 | Kang et al. |
| 6,007,205 A | 12/1999 | Fujimori |
| 6,089,751 A | 7/2000 | Conover et al. |
| 6,104,451 A | 8/2000 | Matsuoka et al. |
| 6,157,432 A | 12/2000 | Helbing |
| 6,181,070 B1 | 1/2001 | Dunn et al. |
| 6,191,839 B1 | 2/2001 | Briley et al. |
| 6,198,222 B1 | 3/2001 | Chang |
| 6,211,934 B1 | 4/2001 | Habing et al. |
| 6,215,655 B1 | 4/2001 | Heady et al. |
| 6,351,381 B1 | 2/2002 | Bilski et al. |
| 6,392,727 B1 | 5/2002 | Larson et al. |
| 6,417,900 B1 | 7/2002 | Shin et al. |
| 6,428,198 B1 | 8/2002 | Saccomanno et al. |
| 6,473,150 B2 | 10/2002 | Takushima et al. |
| 6,493,440 B2 | 12/2002 | Gromatsky et al. |
| 6,504,713 B1 | 1/2003 | Pandolfi et al. |
| 6,535,266 B1 | 3/2003 | Nemeth et al. |
| 6,628,355 B1 | 9/2003 | Takahara |
| 6,701,143 B1 | 3/2004 | Dukach et al. |
| 6,714,410 B2 | 3/2004 | Wellhofer |
| 6,727,468 B1 | 4/2004 | Nemeth |
| 6,812,851 B1 | 11/2004 | Dukach et al. |
| 6,825,828 B2 | 11/2004 | Burke et al. |
| 6,839,104 B2 | 1/2005 | Taniguchi et al. |
| 6,850,209 B2 | 2/2005 | Mankins et al. |
| 6,885,412 B2 | 4/2005 | Ohnishi et al. |
| 6,886,942 B2 | 5/2005 | Okada et al. |
| 6,891,135 B2 | 5/2005 | Pala et al. |
| 6,909,486 B2 | 6/2005 | Wang et al. |
| 6,943,768 B2 | 9/2005 | Cavanaugh et al. |
| 6,961,108 B2 | 11/2005 | Wang et al. |
| 7,015,470 B2 | 3/2006 | Faytlin et al. |
| 7,059,757 B2 | 6/2006 | Shimizu |
| 7,083,285 B2 | 8/2006 | Hsu et al. |
| 7,157,838 B2 | 1/2007 | Thielemans et al. |
| 7,161,803 B1 | 1/2007 | Heady |
| 7,190,587 B2 | 3/2007 | Kim et al. |
| 7,209,349 B2 | 4/2007 | Chien et al. |
| 7,212,403 B2 | 5/2007 | Rockenfeller |
| 7,259,964 B2 | 8/2007 | Yamamura et al. |
| 7,269,023 B2 | 9/2007 | Nagano |
| 7,284,874 B2 | 10/2007 | Jeong et al. |
| 7,452,121 B2 | 11/2008 | Cho et al. |
| 7,457,113 B2 | 11/2008 | Kumhyr et al. |
| 7,480,140 B2 | 1/2009 | Hara et al. |
| 7,535,543 B2 | 5/2009 | Dewa et al. |
| 7,591,508 B2 | 9/2009 | Chang |
| 7,602,469 B2 | 10/2009 | Shin |
| D608,775 S | 1/2010 | Leung |
| 7,667,964 B2 | 2/2010 | Kang et al. |
| 7,752,858 B2 | 7/2010 | Johnson et al. |
| 7,753,567 B2 | 7/2010 | Kang et al. |
| 7,800,706 B2 | 9/2010 | Kim et al. |
| 7,813,124 B2 | 10/2010 | Karppanen |
| 7,903,416 B2 | 3/2011 | Chou |
| 7,995,342 B2 | 8/2011 | Nakamichi et al. |
| 8,004,648 B2 | 8/2011 | Dunn |
| 8,035,968 B2 | 10/2011 | Kwon et al. |
| 8,081,465 B2 | 12/2011 | Nishiura |
| 8,102,173 B2 | 1/2012 | Merrow |
| 8,142,027 B2 | 3/2012 | Sakai |
| 8,208,115 B2 | 6/2012 | Dunn |
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 | 8/2012 | Lee et al. |
| 8,269,916 B2 | 9/2012 | Ohkawa |
| 8,270,163 B2 | 9/2012 | Nakamichi et al. |
| 8,274,622 B2 | 9/2012 | Dunn |
| 8,274,789 B2 | 9/2012 | Nakamichi et al. |
| 8,300,203 B2 | 10/2012 | Nakamichi et al. |
| 8,320,119 B2 | 11/2012 | Isoshima et al. |
| 8,351,014 B2 | 1/2013 | Dunn |
| 8,358,397 B2 | 1/2013 | Dunn |
| 8,369,083 B2 | 2/2013 | Dunn et al. |
| 8,373,841 B2 | 2/2013 | Dunn |
| 8,379,182 B2 | 2/2013 | Dunn |
| 8,400,608 B2 | 3/2013 | Takahashi et al. |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,649,170 B2 | 2/2014 | Dunn et al. |
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |
| 8,700,226 B2 | 4/2014 | Schuch et al. |
| 8,711,321 B2 | 4/2014 | Dunn et al. |
| 8,749,749 B2 | 6/2014 | Hubbard |
| 8,755,021 B2 | 6/2014 | Hubbard |
| 8,758,144 B2 | 6/2014 | Williams et al. |
| 8,760,613 B2 | 6/2014 | Dunn |
| 8,767,165 B2 | 7/2014 | Dunn |
| 8,773,633 B2 * | 7/2014 | Dunn ................ G02F 1/133308 349/161 |
| 8,804,091 B2 | 8/2014 | Dunn et al. |
| 8,823,916 B2 | 9/2014 | Hubbard et al. |
| 8,854,572 B2 | 10/2014 | Dunn |
| 8,854,595 B2 | 10/2014 | Dunn |

(56) References Cited

U.S. PATENT DOCUMENTS

| | | | |
|---|---|---|---|
| 8,879,042 B2 | 11/2014 | Dunn | |
| 8,988,647 B2 | 3/2015 | Hubbard | |
| 9,030,641 B2 | 5/2015 | Dunn | |
| 9,089,079 B2 | 7/2015 | Dunn | |
| 9,119,325 B2 | 8/2015 | Dunn et al. | |
| 9,119,330 B2 | 8/2015 | Hubbard et al. | |
| 9,173,322 B2 | 10/2015 | Dunn | |
| 9,173,325 B2 | 10/2015 | Dunn | |
| 9,282,676 B1 | 3/2016 | Diaz | |
| 9,285,108 B2 | 3/2016 | Dunn et al. | |
| 9,313,917 B2 | 4/2016 | Dunn et al. | |
| 9,370,127 B2 | 6/2016 | Dunn | |
| 9,448,569 B2 | 9/2016 | Schuch et al. | |
| 9,451,060 B1 | 9/2016 | Bowers et al. | |
| 9,451,733 B2 | 9/2016 | Dunn et al. | |
| 9,456,525 B2 | 9/2016 | Yoon et al. | |
| 9,470,924 B2 | 10/2016 | Dunn et al. | |
| 9,500,896 B2 | 11/2016 | Dunn et al. | |
| 9,516,485 B1 | 12/2016 | Bowers et al. | |
| 9,549,490 B2 | 1/2017 | Hubbard | |
| 9,594,271 B2 | 3/2017 | Dunn et al. | |
| 9,613,548 B2 | 4/2017 | DeMars | |
| 9,622,392 B1 * | 4/2017 | Bowers | G06F 1/206 |
| 9,629,287 B2 | 4/2017 | Dunn | |
| 9,648,790 B2 | 5/2017 | Dunn et al. | |
| 9,655,289 B2 | 5/2017 | Dunn et al. | |
| 9,723,765 B2 | 8/2017 | DeMars | |
| 9,894,800 B2 | 2/2018 | Dunn | |
| 2001/0001459 A1 | 5/2001 | Savant et al. | |
| 2001/0019454 A1 | 9/2001 | Tadic-Galeb et al. | |
| 2002/0009978 A1 | 1/2002 | Dukach et al. | |
| 2002/0033919 A1 | 3/2002 | Sanelle et al. | |
| 2002/0065046 A1 | 5/2002 | Mankins et al. | |
| 2002/0084891 A1 | 7/2002 | Mankins et al. | |
| 2002/0101553 A1 | 8/2002 | Enomoto et al. | |
| 2002/0126248 A1 | 9/2002 | Yoshia | |
| 2002/0148600 A1 | 10/2002 | Bosch et al. | |
| 2002/0149714 A1 | 10/2002 | Anderson et al. | |
| 2002/0154255 A1 | 10/2002 | Gromatzky et al. | |
| 2002/0164944 A1 | 11/2002 | Haglid | |
| 2002/0164962 A1 | 11/2002 | Mankins et al. | |
| 2002/0167637 A1 | 11/2002 | Burke et al. | |
| 2003/0007109 A1 | 1/2003 | Park | |
| 2003/0020884 A1 | 1/2003 | Okada et al. | |
| 2003/0043091 A1 | 3/2003 | Takeuchi et al. | |
| 2003/0104210 A1 | 6/2003 | Azumi et al. | |
| 2003/0128511 A1 | 7/2003 | Nagashima et al. | |
| 2003/0214785 A1 | 11/2003 | Perazzo | |
| 2004/0012722 A1 | 1/2004 | Alvarez | |
| 2004/0035558 A1 | 2/2004 | Todd et al. | |
| 2004/0036834 A1 | 2/2004 | Ohnishi et al. | |
| 2004/0103570 A1 | 6/2004 | Ruttenberg | |
| 2004/0105159 A1 | 6/2004 | Saccomanno et al. | |
| 2004/0165139 A1 | 8/2004 | Anderson et al. | |
| 2004/0223299 A1 | 11/2004 | Ghosh | |
| 2005/0012039 A1 | 1/2005 | Faytlin et al. | |
| 2005/0012722 A1 | 1/2005 | Chon | |
| 2005/0062373 A1 | 3/2005 | Kim et al. | |
| 2005/0073632 A1 | 4/2005 | Dunn et al. | |
| 2005/0073639 A1 | 4/2005 | Pan | |
| 2005/0134525 A1 | 6/2005 | Tanghe et al. | |
| 2005/0134526 A1 | 6/2005 | Willem et al. | |
| 2005/0213950 A1 | 9/2005 | Yoshimura | |
| 2005/0229630 A1 | 10/2005 | Richter et al. | |
| 2005/0237714 A1 | 10/2005 | Ebermann | |
| 2005/0276053 A1 | 12/2005 | Nortrup et al. | |
| 2005/0286131 A1 | 12/2005 | Saxena et al. | |
| 2006/0012958 A1 | 1/2006 | Tomioka et al. | |
| 2006/0018093 A1 | 1/2006 | Lai et al. | |
| 2006/0034051 A1 | 2/2006 | Wang et al. | |
| 2006/0056994 A1 | 3/2006 | Van Lear et al. | |
| 2006/0082271 A1 | 4/2006 | Lee et al. | |
| 2006/0092348 A1 | 5/2006 | Park | |
| 2006/0125998 A1 | 6/2006 | Dewa et al. | |
| 2006/0132699 A1 | 6/2006 | Cho et al. | |
| 2006/0177587 A1 | 8/2006 | Ishizuka et al. | |
| 2006/0199514 A1 | 9/2006 | Kimura | |
| 2006/0209266 A1 | 9/2006 | Utsunomiya | |
| 2006/0260790 A1 | 11/2006 | Theno et al. | |
| 2006/0262079 A1 | 11/2006 | Seong et al. | |
| 2006/0266499 A1 | 11/2006 | Choi et al. | |
| 2006/0283579 A1 | 12/2006 | Ghosh et al. | |
| 2007/0019419 A1 | 1/2007 | Hafuka et al. | |
| 2007/0030879 A1 | 2/2007 | Hatta | |
| 2007/0047239 A1 | 3/2007 | Kang et al. | |
| 2007/0065091 A1 | 3/2007 | Hinata et al. | |
| 2007/0076431 A1 | 4/2007 | Atarashi et al. | |
| 2007/0103863 A1 | 5/2007 | Kim | |
| 2007/0103866 A1 | 5/2007 | Park | |
| 2007/0115686 A1 | 5/2007 | Tyberghien | |
| 2007/0139929 A1 | 6/2007 | Yoo et al. | |
| 2007/0140671 A1 | 6/2007 | Yoshimura | |
| 2007/0151274 A1 | 7/2007 | Roche et al. | |
| 2007/0151664 A1 | 7/2007 | Shin | |
| 2007/0171353 A1 | 7/2007 | Hong | |
| 2007/0206158 A1 | 9/2007 | Kinoshita et al. | |
| 2007/0211205 A1 | 9/2007 | Shibata | |
| 2007/0212211 A1 | 9/2007 | Chiyoda et al. | |
| 2007/0217221 A1 | 9/2007 | Lee et al. | |
| 2007/0237636 A1 | 10/2007 | Hsu | |
| 2007/0267174 A1 | 11/2007 | Kim | |
| 2008/0055534 A1 | 3/2008 | Kawano | |
| 2008/0076342 A1 | 3/2008 | Bryant et al. | |
| 2008/0099193 A1 | 5/2008 | Aksamit et al. | |
| 2008/0148609 A1 | 6/2008 | Ogoreve | |
| 2008/0209934 A1 | 9/2008 | Richards | |
| 2008/0218446 A1 | 9/2008 | Yamanaka | |
| 2008/0236005 A1 | 10/2008 | Isayev et al. | |
| 2008/0267790 A1 | 10/2008 | Gaudet et al. | |
| 2008/0283234 A1 | 11/2008 | Sagi et al. | |
| 2008/0285290 A1 | 11/2008 | Ohashi et al. | |
| 2009/0009729 A1 | 1/2009 | Sakai | |
| 2009/0059518 A1 | 3/2009 | Kakikawa et al. | |
| 2009/0086430 A1 | 4/2009 | Kang et al. | |
| 2009/0120629 A1 | 5/2009 | Ashe | |
| 2009/0126906 A1 | 5/2009 | Dunn | |
| 2009/0126907 A1 | 5/2009 | Dunn | |
| 2009/0126914 A1 | 5/2009 | Dunn | |
| 2009/0135365 A1 | 5/2009 | Dunn | |
| 2009/0147170 A1 | 6/2009 | Oh et al. | |
| 2009/0154096 A1 | 6/2009 | Iyengar et al. | |
| 2009/0174626 A1 | 7/2009 | Isoshima et al. | |
| 2009/0244472 A1 | 10/2009 | Dunn | |
| 2009/0279240 A1 | 11/2009 | Karppanen | |
| 2011/0122162 A1 | 5/2011 | Sato et al. | |

FOREIGN PATENT DOCUMENTS

| | | |
|---|---|---|
| EP | 1647766 A2 | 4/2006 |
| EP | 1762892 A1 | 3/2007 |
| EP | 1951020 A1 | 7/2008 |
| GB | 2402205 A | 12/2004 |
| JP | 402062015 A | 3/1990 |
| JP | 402307080 A | 12/1990 |
| JP | 3153212 A | 7/1991 |
| JP | H062337 U | 1/1994 |
| JP | 6082745 A | 3/1994 |
| JP | 8115788 A | 5/1996 |
| JP | 8194437 A | 7/1996 |
| JP | H08305301 A | 11/1996 |
| JP | 8339034 A | 12/1996 |
| JP | H09246766 A | 9/1997 |
| JP | 11160727 A | 6/1999 |
| JP | H11296094 A | 10/1999 |
| JP | 2001209126 A | 8/2001 |
| JP | 2002158475 A | 5/2002 |
| JP | 2004053749 A | 2/2004 |
| JP | 2005017556 A | 1/2005 |
| JP | 2000131682 A | 5/2005 |
| JP | 2005134849 A | 5/2005 |
| JP | 2005265922 A | 9/2005 |
| JP | 2006513577 A | 4/2006 |
| JP | 2007322718 A | 5/2006 |
| JP | 2006148047 A | 6/2006 |

(56) References Cited

FOREIGN PATENT DOCUMENTS

| | | |
|---|---|---|
| JP | 2006163217 A | 6/2006 |
| JP | 2007003638 A | 1/2007 |
| JP | 09307257 A | 11/2007 |
| JP | 2007293105 A | 11/2007 |
| JP | 2008010361 A | 1/2008 |
| JP | 2008292743 A | 12/2008 |
| KR | 200366674 Y1 | 11/2004 |
| KR | 20050033986 A | 4/2005 |
| KR | 200401354 Y1 | 11/2005 |
| KR | 20060016469 A | 2/2006 |
| KR | 100666961 B1 | 1/2007 |
| KR | 1020070070675 A | 4/2007 |
| KR | 1020070048294 | 8/2007 |
| WO | WO2005079129 A1 | 8/2005 |
| WO | WO2007116116 A1 | 10/2007 |
| WO | WO2008050660 A2 | 5/2008 |
| WO | WO2009065125 A2 | 5/2009 |
| WO | WO2009065125 A3 | 5/2009 |
| WO | WO2009135308 A1 | 11/2009 |

OTHER PUBLICATIONS

Novitsky, Driving LEDs versus CCFLs for LCD backlighting, Nov. 12, 2007, 6 pages.
Sunbritetv, All Weather Outdoor LCD Television Model 4610HD, 2008, 1 page.
Sunbritetv, Introduces Two New All-Weather Outdoor Televisions InfoComm 2008, 7 pages.
Zeeff, T.M., EMC analysis of an 18" LCD monitor, 2000, 1 page.
Mentley, David E., State of Flat-Panel Display Technology and Future Trends, Proceedings of the IEEE, Apr. 2002, vol. 90, No. 4, pp. 453-459.
CIVIQ, Invalidity Contentions, Jan. 24, 2018, 51 pages.
CIVIQ, Invalidity Claim Chart, Appendix I, Mar. 22, 2018, 4 pages.
CIVIQ, Invalidity Claim Charts, Appendix A-Appendix D, Jan. 24, 2018, 51 pages.
Bureau of Ships Navy Department, Guide Manual of Cooling methods for Electronic Equipment, Mar. 31, 1955, 212 pages.
Scott, Cooling of Electronic Equipment, Apr. 4, 1947, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Wankhede, Evaluation of Cooling Solutions for Outdoor Electronics, Sep. 17-19, 2007, 6 pages.
Yeh, Thermal Management of Microelectronic Equipment, Oct. 15, 2002, 148 pages.
CIVIQ, Invalidity Claim Charts, Appendix F to H, Mar. 22, 2018, 18 pages.
Yung, Using Metal Core Printed Circuit Board as a Solution for Thermal Management article, 2007, 5 pages.
*CIVIQ Smartscapes LLC. V Manufacturing Resources International, Inc.*, Petition for Inter Partes Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages.

* cited by examiner

ELECTRONIC DISPLAY ASSEMBLY HAVING THERMAL COOLING PLATE AND OPTIONAL CONVECTIVE AIR COOLING LOOP

CROSS-REFERENCE TO RELATED APPLICATIONS

This application is a continuation of U.S. application Ser. No. 13/954,469, filed on Jul. 30, 2013, now U.S. Pat. No. 9,313,917, issued on Apr. 12, 2016. U.S. application Ser. No. 13/954,469 is a continuation of U.S. application Ser. No. 12/630,469, filed on Dec. 3, 2009, now U.S. Pat. No. 8,497,972. application Ser. No. 12/630,469 is a continuation in part of U.S. application Ser. No. 12/618,104, filed Nov. 14, 2009, now U.S. Pat. No. 8,310,824 issued on Nov. 13, 2012. All aforementioned applications are hereby incorporated by reference in their entirety as if fully cited herein

FIELD OF THE INVENTIVE CONCEPT

The exemplary embodiments herein are directed towards an electronic display having a thermal plate with an optional cooling loop for conductive and convective cooling.

BACKGROUND OF THE INVENTIVE FIELD

Electronic displays are now being used for not only indoor entertainment purposes, but are now being utilized for indoor and outdoor advertising/informational purposes. For example, liquid crystal displays (LCDs), plasma displays, light emitting diode (LED), electroluminescence, light-emitting polymers, organic light emitting diode displays (OLEDs) and many other displays can now be used to display information and advertising materials to consumers in locations outside of their own home or within airports, arenas, transit stations, stadiums, restaurants/bars, gas station pumps, billboards, and even moving displays on the tops of automobiles or on the sides of trucks.

The rapid development of these displays has allowed users to mount them in a variety of locations that were not previously available. Further, the popularity of high definition (HD) television has increased the demand for larger and brighter displays, especially large displays which are capable of producing HD video. The highly competitive field of consumer advertising has also increased the demand for large, attention-grabbing, bright displays When used outdoors, high ambient temperatures and solar loading can present several thermal-regulatory issues. When a display is exposed to direct sunlight this can increase the temperature of the display dramatically due to the solar loading of the front display surface due to the radiative heat of the sun. It has been found, that moving air through a gap between the exterior transparent plate and the image assembly can sometimes provide adequate cooling of the display assembly. Further, when producing an image with a display that has been placed in direct sunlight, the illumination of the display assembly must overcome the high ambient light levels. Thus, the display must be very bright and sometimes produce high levels of illumination which can generate high levels of heat coming from the image assembly (or backlight if necessary). This heat must be removed from the display or it may damage the electrical assemblies. If an LCD is used, high internal temperatures can cause the liquid crystal material to malfunction and may produce noticeable failures on the image. LEDs can degrade in performance and efficiency when exposed to high temperatures. Other technologies (OLED, light-emitting polymers, etc.) can also malfunction when exposed to high temperatures.

SUMMARY OF THE EXEMPLARY EMBODIMENTS

An exemplary embodiment may contain a thermal plate which can transfer heat from the image assembly to the housing of the display and into the ambient air through convection. A transparent plate assembly may be used which can provide the front surface for a narrow channel of cooling air which may be directed between the transparent plate assembly and the image assembly. The cooling air can also pass over the thermal plate in order to aid in cooling the thermal plate. In some embodiments, the thermal plate may run the entire length of the image assembly and may contain several apertures which allow cooling air to pass through the plate. When using an LCD display with an LED backlight, the heat generated by the LED backlight can also be transferred through the thermal plate and into the display housing as well as the cooling air. The display housing can be sealed and does not require an inlet of ambient air so that the display can be used in environments which have contaminates (dust, grease, pollen, dirt, leaves, garbage, water, insects, smoke, salt, fumes, etc.) present within the ambient air.

The exemplary embodiments herein are not intended to be exhaustive or to unnecessarily limit the scope of the invention. The exemplary embodiments were chosen and described in order to explain the principles so that others skilled in the art may practice the embodiments. Having shown and described exemplary embodiments, those skilled in the art will realize that many variations and modifications may be made to affect the described invention. Many of those variations and modifications will provide the same result and fall within the spirit of the exemplary embodiments. It is the intention, therefore, to limit the embodiments only as indicated by the scope of the claims.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Figure 1:
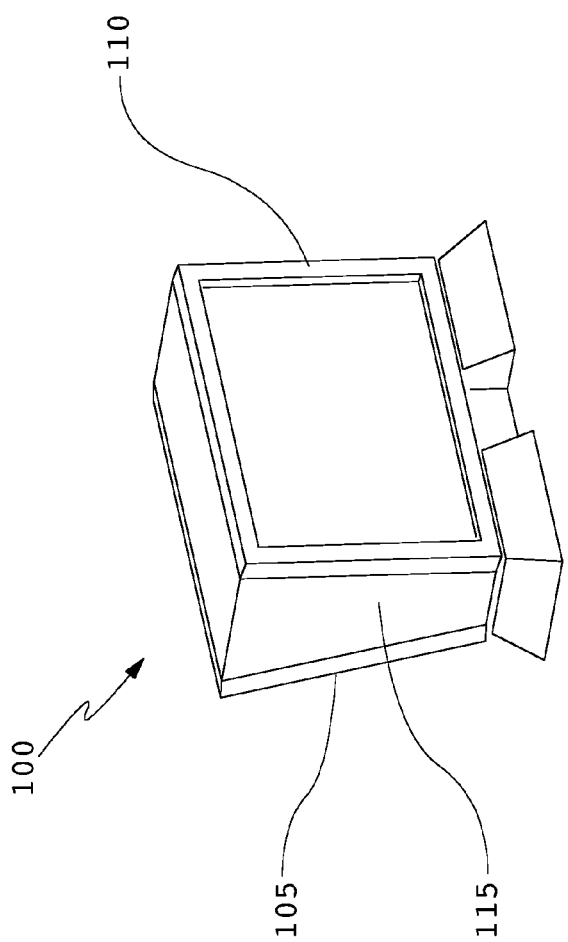
FIG. 1 provides a perspective view of an embodiment which uses two displays in a back-to-back arrangement.

FIG. 1 provides a perspective view of one embodiment which uses a dual-display assembly 100. In a preferred embodiment, the housing 115 and the door frames 105 and 110 would provide an environmentally-sealed enclosure to protect the internal components of the display assembly 100 from damage due to dust, grease, pollen, dirt, leaves, garbage, water, insects, smoke, salt, fumes, etc. Although shown with two displays back-to-back, this setup is not required. A single display assembly can be used as well. The exemplary embodiments herein are capable of cooling the display without having to ingest ambient air (although this can be used if desired).

Figure 2:
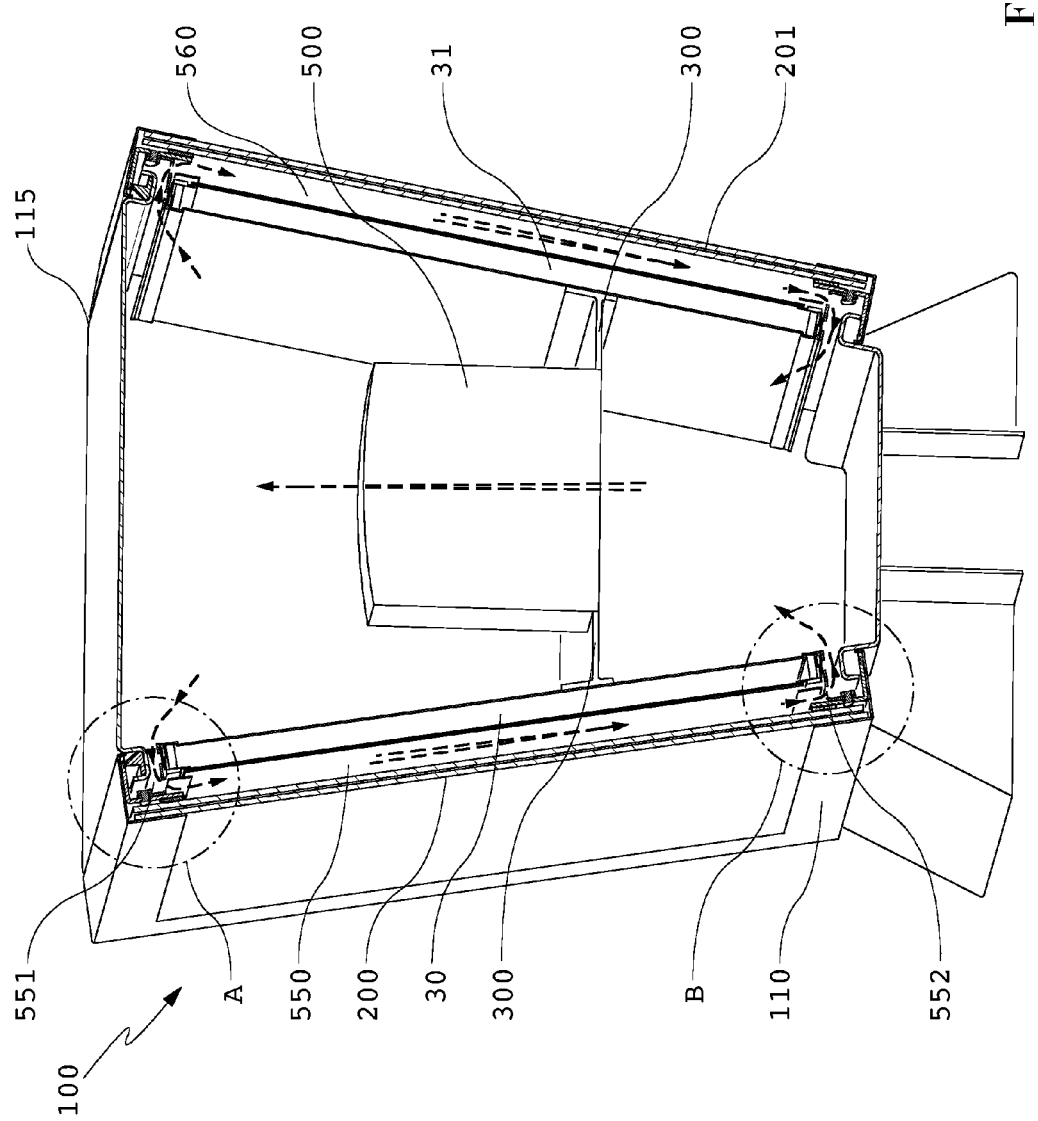
FIG. 2 provides a perspective sectional view of the embodiment shown in FIG. 1 and showing the air flow through the housing.

FIG. 2 provides a sectional view of the embodiment shown in FIG. 1. This figure illustrates the air flow (dashed lines) through the housing 115. A transparent plate assembly 200 may be placed in front of the image assembly 30. For this embodiment, the transparent plate assembly 200 may be contained within the door frame 110 which is then attached to the housing 115. However, in other embodiments the door frame would not be a separate piece but would simply be provided by the housing. In these embodiments, the housing 115 would extend around the transparent plate assembly 200 without the need for a separate door frame 110.

The image assembly 30 will vary depending on the type of display being used with the particular embodiment. For example, if an LCD display is being used the image assembly 30 will typically comprise several layers including: a backlight, front and rear polarizers, liquid crystal material sandwiched between two transparent plates, an electrically-conductive layer, and possibly additional polarizing/anti-reflective layers. An OLED display on the other hand, may comprise: a cathode, emissive layer, conductive layer, and an anode. As mentioned above, embodiments can be practiced with any type of flat panel display, including but not limited to: LCD, OLED, plasma, light emitting polymer (LEP) and organic electro luminescence (OEL) displays.

The transparent plate assembly 200 can be made of a variety of materials and may have one or more layers. Various transparent glasses, plastics, or composite materials may be used to produce the transparent plate assembly 200. However, in an exemplary embodiment the transparent plate assembly 200 would be made of glass and even more preferably would be made of two or more plates of glass which are laminated together with index-matching optical adhesive. Further, an exemplary embodiment would also contain a polarizer on the transparent plate assembly 200. Preferably, the polarizer would be placed on the inside surface of the glass assembly and would also contain an anti-reflective (AR) layer. It has been found that adding the polarizer layer on the transparent plate assembly 200 can reduce reflections and also reduce the solar loading on the image assembly 30.

A channel 550 may be defined by the rear surface of the transparent plate assembly 200 and the front surface of the image assembly 30. The channel 550 has an inlet opening 551 and exit opening 552. In the dual-display embodiment, the display assembly 100 is mostly symmetrical, having a second channel 560, second image assembly 31, and second transparent plate assembly 201 on the opposing side of the dual-display assembly 100.

A fan 500 may be used to draw air through the channels 560 and 550 and circulate it though the housing 115. While being circulated through the housing 115, the air may transfer heat to the interior walls of the housing 115 where it can then be transferred from the housing 115 to the ambient air. In an exemplary embodiment, the fan 500 may be mounted on a separating plate 300 which divides the interior cavity of the housing 115 into upper and lower portions. It has been found that this type of setup may provide an area of high pressure in one portion and low pressure in the other portion which can further drive the movement of air throughout the cavity. For example, in an exemplary embodiment the separating plate 300 may be used to create an area of high pressure in the top portion (near the inlet opening 551 of the channel 550) and an area of low pressure in the bottom portion (near the exit opening 552 of the channel 550) which may drive the air to flow through the channel 550 and return to the fan 500.

It has been found that solar loading of the front surface of the image assembly 31 and 30 can occur when the display assembly 100 is used in direct sunlight. This solar loading can result in a heat buildup on the front surface of the image assembly 30 and 31. By using the channels 560 and 550, this heat can be removed from the image assemblies and transferred to the display housing 115 (and optionally the door frame 110) where it can be transferred to the ambient air through convection.

Thus, in an exemplary embodiment, the thermal conductivity of the display housing 115 and door frame 110 would be high. Thus, metals are an exemplary material for constructing the display housing 115 and door frame 110. Preferably, there would be a low level of thermal resistivity between the inner and outer surfaces of the housing 115 and door frame 110 so that heat can be effectively transferred to the surrounding ambient air. Thermoelectric modules (not shown) may also be used in order to cool the interior of the display housing 115. Fins or heat sinks (not shown) may also be placed on the interior or exterior of the housing 115 and/or door frame 110 to increase the ability to absorb heat from the interior of the display and transfer it to the ambient surroundings.

Figure 3:
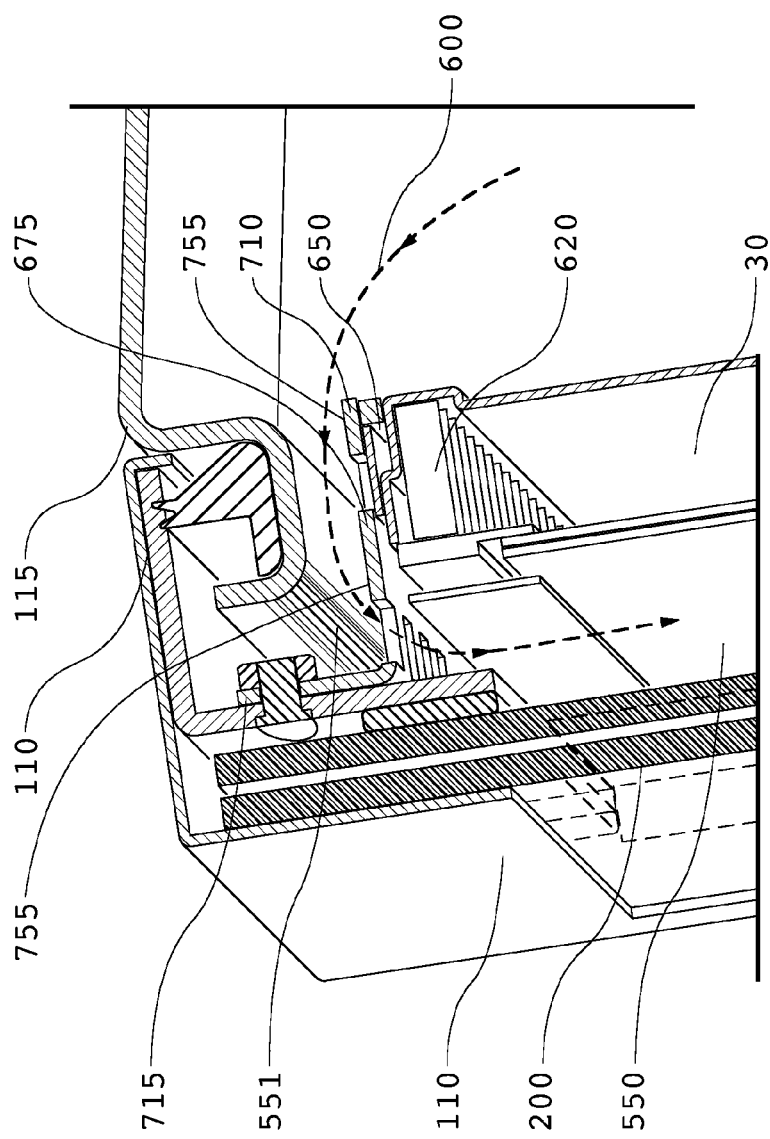
FIG. 3 provides a detailed view of insert A from FIG. 2.

FIG. 3 provides a detailed view of insert A from FIG. 2. In this embodiment, an LED edge-lit LCD is used as the image assembly 30. An array of LEDs 620 are provided along the edge of the LCD in order to provide a source of illumination. When used in outdoor environments, the illumination of the image assembly 30 must compete with the ambient light levels and sometimes with direct sunlight. In order to remain visible (and preferably very bright and clear), the illumination coming from the image assembly 30 must of course be brighter than the surroundings. Thus, when using an LED backlit LCD, the LEDs 620 must produce a high level of luminance which can sometimes cause the LEDs 620 to generate a substantial amount of heat.

The various optical properties of the light which is output from an LED are typically dependant upon temperature. Thus, as the temperature of the LED array 620 varies, the optical properties of the light may vary as well. These variations are undesirable because they may alter the image (color saturation, color temperature, brightness, contrast, etc.) that is being produced by the image assembly 30. Therefore, in an exemplary embodiment the heat that is produced by the image assembly 30 (in this case an edge-lit LED LCD) may be removed to maintain the image assembly 30 at a consistent temperature. This helps to ensure image accuracy as well as avoids damage or a shortened lifetime due to high temperatures.

Although described here in relation to an LED edge-lit LCD, it should be noted that these thermal effects are also observed when using other types of image assemblies, including but not limited to: plasma displays, direct backlit LCDs, light emitting diode (LED) displays, electroluminescence, light-emitting polymers, and organic light emitting diode displays (OLEDs). Thus, embodiments can be designed which would remove heat from these image assemblies as well.

In the embodiment shown in FIG. 3, the LED array 620 is placed in thermal communication with the door frame 110 and optionally the housing 115 as well. Once the heat has been transferred to the door frame 110 (and optionally the housing 115) it may be transferred to the ambient surroundings through convection. In an exemplary embodiment, a thermal plate 675 may be used to place the LED array 620 in thermal communication with the door frame 110 (and optionally the housing 115). An exemplary thermal plate 675 would have an 'L-shaped' cross-section containing a first and second portion. The first portion would have a distal end 710 and the second portion would have a distal end 715 where the two portions are joined at their proximal ends 712 (see FIGS. 4 and 5) in order to form the 'L' shape. (See FIG. 5 for more information on an exemplary thermal plate).

For the embodiment shown in FIG. 3, heat from the LED array 620 is transferred to the distal end 710 of the first portion of the thermal plate 675 where it may be transferred by conduction to the distal end 715 of the second portion. Once the heat has been transferred to the distal end 715 of the second portion then it may be transferred to the door frame 110. In an exemplary embodiment, the door frame 110 would also be in thermal communication with the housing 115 so that heat can also be transferred (preferably by conduction) to the housing 115 and further dissipate to the surroundings. As discussed above, in other embodiments the door frame 110 would not be a separate piece but would simply be provided by the housing 115. In these embodiments, the housing 115 would extend around the transparent plate assembly 200 without the need for a separate door frame 110. Thus, with these embodiments the thermal plate 675 would simply be in thermal communication with the housing 115.

An exemplary thermal plate 675 would also be placed in the path of cooling air 600, which aids in the transfer of heat from the LED array 620. As the heat moves from the distal end 710 of the first portion to the distal end 715 of the second portion, a plurality of apertures (see FIG. 5) may be located on the thermal plate 675 to allow the cooling air 600 to pass through the thermal plate 675 and traverse through channel 550. Optionally, the cooling air 600 can also pass over the surfaces of the thermal plate which oppose the LED array (see element 755 of FIG. 5). The cooling air 600 may be used to cause convective heat transfer from the thermal plate 675. A heat sink 650 may be used to place the LED array 620 and the thermal plate 675 in thermal communication with one another.

Specifically, when used with edge-lit LCDs, the exemplary embodiments have been found to be very effective in removing heat from the backlight. Edge-lit backlights concentrate a large amount of the heat along the edges of the image assembly 30. Because most of the heat is concentrated along the edges, it can be effectively removed by an exemplary thermal plate 675.

Figure 4:
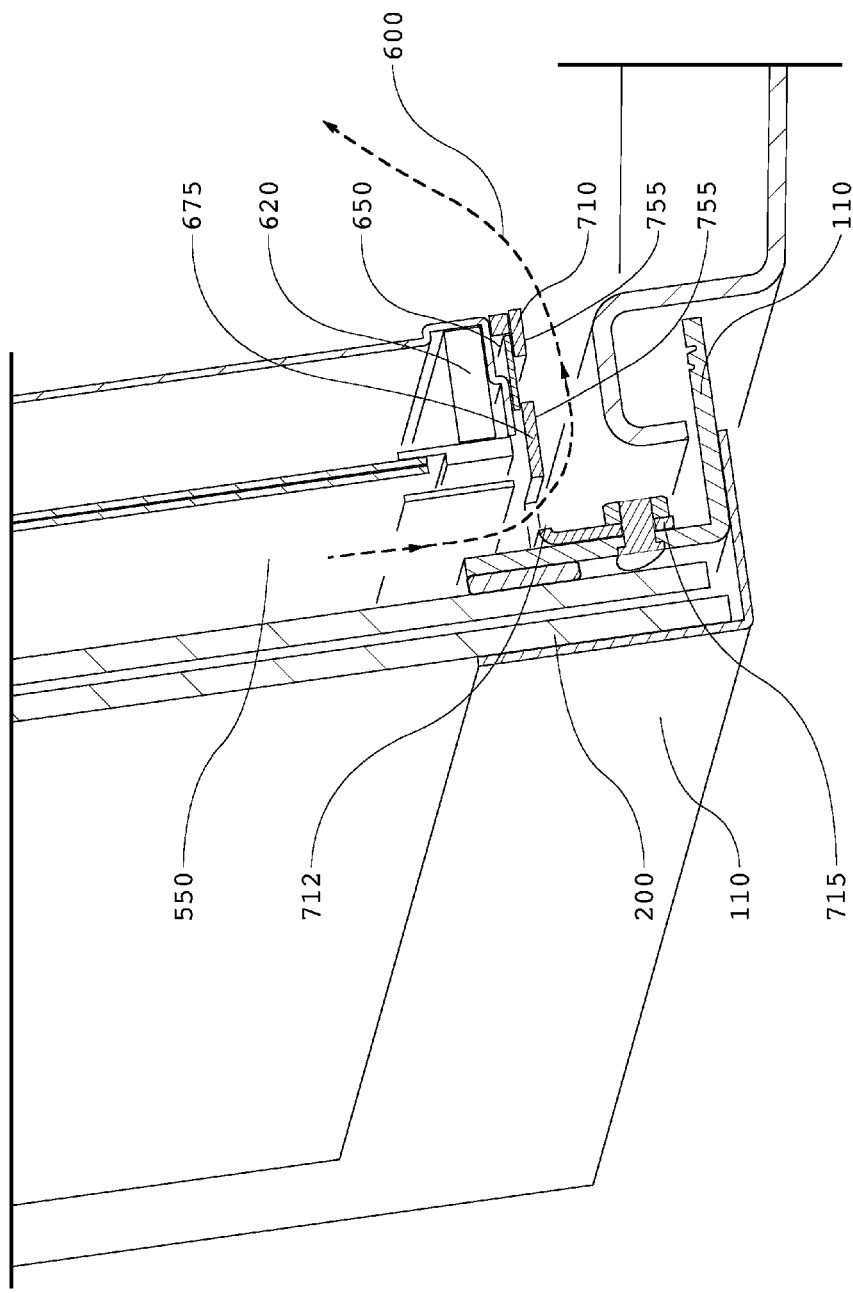
FIG. 4 provides a detailed view of insert B from FIG. 2.

FIG. 4 provides a detailed view of insert B from FIG. 2. Here, a similar configuration as shown in FIG. 3 may be used. For this embodiment, the LED array 620 may be placed in thermal communication with the door frame 110 and optionally the housing 115 as well. Once the heat has been transferred to the door frame 110 (and optionally the housing 115) it may be transferred to the ambient surroundings through convection. In an exemplary embodiment, a thermal plate 675 may be used to place the LED array 620 in thermal communication with the door frame 110 (and optionally the housing 115).

For the embodiment shown in FIG. 4, heat from the LED array 620 is transferred to the distal end 710 of the first portion of the thermal plate 675 where it may be transferred by conduction to the distal end 715 of the second portion. Once the heat has been transferred to the distal end 715 of the second portion then it may be transferred to the door frame 110 where it can then be transferred to the ambient surroundings. In an exemplary embodiment, the door frame 110 would also be in thermal communication with the housing 115 so that heat can also be transferred (preferably by conduction) to the housing 115 and further dissipate to the surroundings. As discussed above, in other embodiments the door frame 110 would not be a separate piece but would simply be provided by the housing 115. In these embodiments, the housing 115 would extend around the transparent plate assembly 200 without the need for a separate door frame 110. Thus, with these embodiments the thermal plate 675 would simply be in thermal communication with the housing 115.

An exemplary thermal plate 675 would also be placed in the path of cooling air 600, which aids in the transfer of heat from the LED array 620 (or image assembly 30—if an edge-lit LCD is not being used). As the heat moves from the distal end 710 of the first portion to the distal end 715 of the second portion, a plurality of apertures (see FIG. 5) may be located on the thermal plate 675 to allow the cooling air 600 to pass through the thermal plate 675 and traverse through channel 550. Optionally, the cooling air 600 can also pass over the surfaces of the thermal plate which oppose the LED array (see element 755 of FIG. 5). The cooling air 600 may be used to cause convective heat transfer from the thermal plate 675. A heat sink 650 may be used to place the LED array 620 and the thermal plate 675 in thermal communication with one another.

Figure 5:
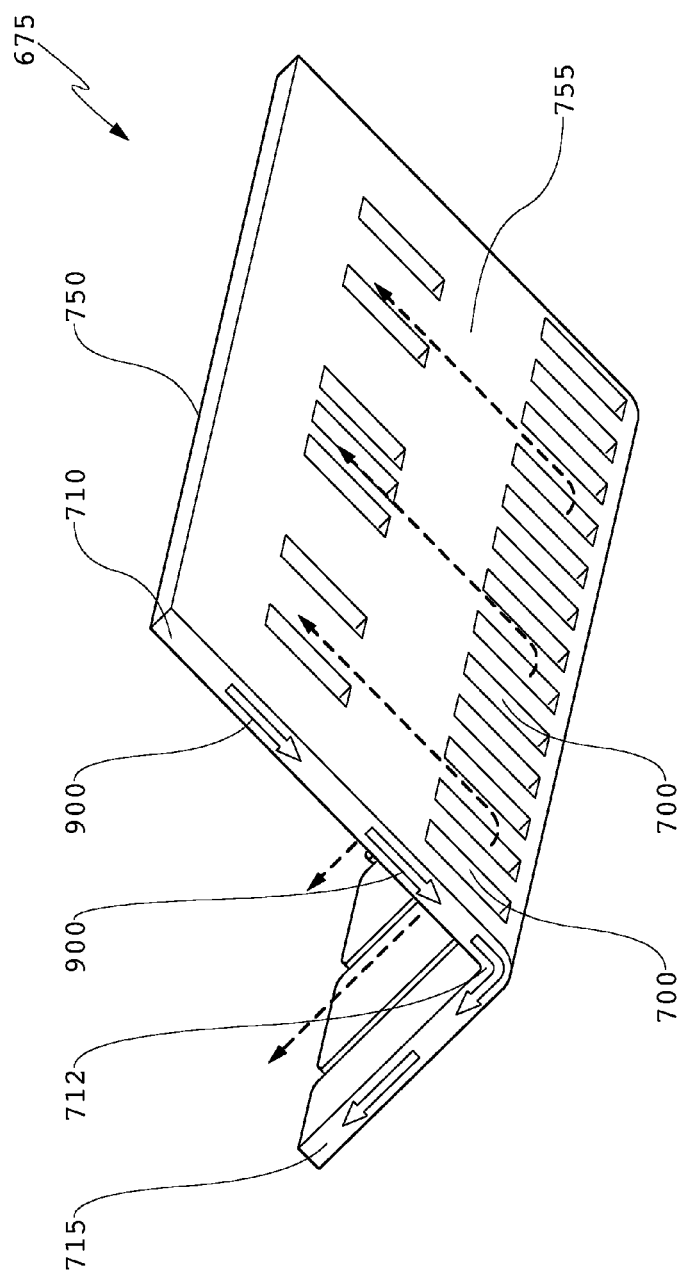
FIG. 5 provides a perspective view of one embodiment for an exemplary thermal plate.

FIG. 5 provides a perspective view of an exemplary embodiment for a thermal plate 675. As discussed above, an exemplary thermal plate 675 would have an 'L-shaped' cross-section containing a first and second portion. The first portion would have a distal end 710 and the second portion would have a distal end 715 where the two portions are joined at their proximal ends 712 in order to form the 'L' shape.

The LED array (or any other heat-producing portion of an image assembly 30) may be in thermal communication with surface 750 of the thermal plate 675. This heat may be transferred to the opposing side of the thermal plate 755 where cooling air (dashed lines) may pass over the surface 750 in order to remove the heat by convection. The remaining heat (indicated by the arrows 900) can also travel towards the proximal end 712 of the first portion where a plurality of apertures 700 allow the cooling air (dashed lines) to pass through the thermal plate 675 and further extract heat. Any heat that is still remaining (indicated by the arrows 900) continues to travel along the thermal plate 675 towards the distal end 715 of the second portion which is preferably in thermal communication with the door frame 110 (or the housing 115 or both the housing 115 and the door frame 110). The remaining heat is then transferred to the various portions of the door frame 110 and optionally the housing 115 so that it can be removed by convection into the surrounding ambient air.

Some embodiments may not utilize the apertures 700 in the thermal plate 675. Alternatively, these designs may use a plurality of smaller thermal plates 675 (those which do not run the entire length of the image assembly) and allow spacing in between these smaller plates for the cooling air to pass through.

The door frames 110 and 105, thermal plate(s) 675, and housing 115 would preferably be made out of a thermally conductive material and preferably with a low thermal resistance. An exemplary material may be metal, and preferably formed sheet metal, but could also be cast and/or machined or injection molded. Any thermally-conductive materials can be used.

Again, while some embodiments have been described herein with reference to back-to-back displays, the various teachings can be used with single display setups as well. In an exemplary embodiment, the thermal plate and cooling loop arrangement can be used in combination with a single display setup. Alternatively, the thermal plate could be used with or without the cooling air loop, in a single or dual display setup.

Exemplary embodiments provide display assemblies which may be mounted in areas which are subject to high ambient temperatures and even direct sunlight and will be able to dissipate the solar load as well as the heat produced by the image assembly and/or backlight (if necessary). The exemplary embodiments herein are capable of cooling the display without having to ingest ambient air (although this can be used if desired) which can be especially useful in environments which contain contaminates in the ambient air.

While certain embodiments are described in detail above, the scope of the invention is not to be considered limited by such disclosure, and modifications are possible without departing from the spirit of the invention as evidenced by the following claims.

What is claimed is:

1. An electronic display assembly comprising:
a thermally conductive housing;
a liquid crystal display positioned within the thermally conductive housing;
a backlight positioned to illuminate the liquid crystal display;
a thermal plate in conductive thermal communication with the backlight and with the thermally conductive housing; and
one or more air flow apertures that pass through the thermal plate.

2. The electronic display assembly of claim 1 wherein:
the thermal plate is positioned between an edge of the liquid crystal display and the housing.

3. The electronic display assembly of claim 1 wherein:
the backlight is a LED backlight.

4. The electronic display assembly of claim 1 further comprising:
a fan located within the thermally conductive housing and configured to cause a flow of cooling air through the one or more apertures in the thermal plate.

5. The electronic display assembly of claim 4 wherein:
the one or more apertures are oriented horizontally relative to the ground when the electronic display is in a typical viewing orientation, while the flow path of the cooling air extends vertically through the one or more apertures.

6. The electronic display assembly of claim 1 wherein:
the thermal plate is located and configured to transfer heat from the backlight to the thermally conductive housing.

7. The electronic display assembly of claim 4 wherein:
the thermal plate is located and configured to accept heat from the backlight, and is positioned for convective removal of said heat by the flow of cooling air.

8. The electronic display assembly of claim 1 wherein:
the thermal plate and housing are metallic.

9. An electronic display assembly comprising:
a thermally conductive housing having a front portion which faces an intended observer;
a liquid crystal display positioned within the thermally conductive housing;
a backlight positioned behind the liquid crystal display;
a thermal plate in contact with the backlight and with the thermally conductive housing; and
one or more air flow apertures that pass through the thermal plate.

10. The electronic display assembly of claim 9 wherein:
the thermal plate is located and configured to absorb heat from the backlight and to transfer the heat forwardly towards the front portion of the thermally conductive housing.

11. The electronic display assembly of claim 9 wherein:
the thermal plate contains a portion which is oriented substantially horizontally, and is positioned above both the backlight and the liquid crystal display.

12. The electronic display assembly of claim 9 wherein:
the backlight is a LED backlight.

13. The electronic display assembly of claim 9 wherein:
the thermal plate is positioned in a cooling air path that travels over and through the thermal plate.

14. The electronic display assembly of claim 13 further comprising:
a fan located within the thermally conductive housing and configured to cause cooling air to flow within the cooling air path.

15. The electronic display assembly of claim 13 wherein:
the cooling air path travels through the apertures within the plate.

16. An electronic display assembly comprising:
a thermally conductive housing;
a liquid crystal display positioned within the thermally conductive housing;
a backlight having a top portion and a bottom portion and positioned to backlight the liquid crystal display;
a top thermal plate contacting the top portion of the backlight; and
a bottom thermal plate contacting the bottom portion of the backlight;
wherein the top thermal plate and the bottom thermal plate are located and configured to transfer heat from the backlight to the thermally conductive housing.

17. The electronic display assembly of claim 16 further comprising:
one or more fans located within the thermally conductive housing and configured to cause a flow of cooling air that will pass through one or more apertures in the top thermal plate and the bottom thermal plate.

18. The electronic display assembly of claim 17 further comprising:
a vertically oriented channel through the housing, the channel forming a cooling air pathway between the thermal plates.

19. The electronic display assembly of claim 16 wherein:
the top thermal plate spans across the backlight and the liquid crystal display and is located above the backlight and the liquid crystal display; and
the bottom thermal plate spans across the backlight and the liquid crystal display and is located below the backlight and the liquid crystal display.

20. The electronic display assembly of claim 16 further comprising:
one or more apertures passing through the top thermal plate;
one or more apertures passing through the bottom thermal plate; and
a fan located within the thermally conductive housing and configured to cause a flow of cooling air to pass through the aperture(s) in the top thermal plate and the aperture(s) in the bottom thermal plate.

* * * * *